(12) United States Patent
Qin et al.

(10) Patent No.: US 10,797,085 B2
(45) Date of Patent: Oct. 6, 2020

(54) DISPLAY PANELS AND DISPLAY DEVICES

(71) Applicant: Kunshan Go-Visionox Opto-Electronics Co., Ltd., Kunshan (CN)

(72) Inventors: Xu Qin, Kunshan (CN); Yuying Hang, Kunshan (CN); Jinfang Zhang, Kunshan (CN); Lu Zhang, Kunshan (CN); Siming Hu, Kunshan (CN); Zhenzhen Han, Kunshan (CN)

(*) Notice: Subject to any disclaimer, the term of this patent is extended or adjusted under 35 U.S.C. 154(b) by 0 days.

(21) Appl. No.: 16/435,558

(22) Filed: Jun. 10, 2019

(65) Prior Publication Data
US 2019/0296051 A1  Sep. 26, 2019

Related U.S. Application Data

(63) Continuation of application No. PCT/CN2018/111717, filed on Oct. 24, 2018.

(30) Foreign Application Priority Data

May 14, 2018 (CN) .......................... 2018 1 0456794

(51) Int. Cl.
| | | |
|---|---|---|
| H01L 31/036 | (2006.01) | |
| H01L 29/15 | (2006.01) | |
| H01L 29/04 | (2006.01) | |
| H01L 27/14 | (2006.01) | |
| H01L 27/12 | (2006.01) | |

(52) U.S. Cl.
CPC .................................. H01L 27/124 (2013.01)

(58) Field of Classification Search
CPC .......................... H01L 27/124; H01L 27/1255
See application file for complete search history.

(56) References Cited

U.S. PATENT DOCUMENTS

| | | |
|---|---|---|
| 2017/0249896 A1 | 8/2017 | Kim et al. |
| 2017/0301280 A1 | 10/2017 | Ka et al. |
| 2018/0090061 A1 | 3/2018 | Kim et al. |

(Continued)

FOREIGN PATENT DOCUMENTS

| | | |
|---|---|---|
| CN | 107134473 A | 9/2017 |
| CN | 107301831 A | 10/2017 |

(Continued)

OTHER PUBLICATIONS

CN First Office Action dated Mar. 8, 2019 in the corresponding CN application (application No. 201810456794.0).

*Primary Examiner* — Ismail A Muse
(74) *Attorney, Agent, or Firm* — Kilpatrick Townsend & Stockton

(57) ABSTRACT

Provided is a display panel, which includes a first sub-display area, a second sub-display area, and a non-display area. A number of pixel units in the first sub-display area unit is less than a number of pixel units in the second sub-display area. The first sub-display area includes a first a scanning wire. A fixed potential signal wire of the non-display area includes a first signal wire and a second signal wire. The second signal wire is connected to the first signal wire. The second signal wire includes a connecting portion and strip portions connected to the connecting portion and arranged at intervals. A width of the second signal wire is greater than a width of the first signal wire.

15 Claims, 4 Drawing Sheets

(56) References Cited

U.S. PATENT DOCUMENTS

2018/0158417 A1 6/2018 Xiang et al.
2018/0166018 A1 6/2018 Yang
2019/0304999 A1* 10/2019 Wang .................. G06F 3/04164

FOREIGN PATENT DOCUMENTS

| | | |
|---|---|---|
| CN | 107481669 A | 12/2017 |
| CN | 107610636 A | 1/2018 |
| CN | 107749247 A | 3/2018 |
| CN | 107871767 A | 4/2018 |
| CN | 107966864 A | 4/2018 |
| CN | 109116644 A | 1/2019 |
| KR | 20090005651 A | 1/2009 |
| WO | 2017172357 A1 | 10/2017 |

* cited by examiner

US 10,797,085 B2

DISPLAY PANELS AND DISPLAY DEVICES

CROSS-REFERENCES TO RELATED APPLICATIONS

This application is a continuation application for International Application PCT/CN2018/111717, filed on Oct. 24, 2018, which claims the priority benefit of Chinese Patent Application No. 201810456794.0, titled "DISPLAY PANEL AND DISPLAY DEVICE" and filed on May 14, 2018. The entireties of both applications are incorporated by reference herein for all purposes.

FIELD

The present disclosure relates to the field of display.

BACKGROUND

At present, a common display device, such as a monitor, a television, a mobile phone, a tablet, etc., usually has a regular rectangular display screen. With the development of display technology, the rectangular display screen can no longer meet diverse requirements of users. Thus, shape of the display screen is increasingly diverse.

Typically, a non-rectangular display screen is known as a special-shaped display screen. The special-shaped display screen includes a special-shaped display area and a non-special-shaped display area. A number of each row of pixel units in the special-shaped display area is different from a number of each row of pixel units in the non-special-shaped display area. When a scanning wire provides the same scan signal for the pixel units in a corresponding row, the special-shaped display area and the non-special-shaped display area may have different loads on the scanning wire due to a difference in the number of each row of the pixel units.

SUMMARY

Accordingly, it is necessary to provide a display panel and a display device for the problem of a width difference of the power wire.

A display panel includes:
a display area;
and a non-display area disposed around the display area;
where the display area includes a first sub-display area and a second sub-display area, the first sub-display area includes a plurality of pixel units arranged in an array and a first scanning wire connecting each row of the pixel units; the second sub-display area includes a plurality of pixel units arranged in an array;
the non-display area includes a fixed potential signal wire, the fixed potential signal wire includes a first signal wire and a second signal wire, the second signal wire is connected to the first signal wire, and the second signal wire includes a connecting portion and strip portions connected to the connecting portion and arranged at intervals, a width of the second signal wire is greater than a width of the first signal wire; and
the display panel further includes a leading-out wire, the leading-out wire is correspondingly connected to the first scanning wire, and extends to the non-display area to overlap with the second signal wire, the second signal wire and the leading-out wire are provided at different layers, the second signal wire and the leading-out wire are used to generating a parasitic capacitance to compensate a load of the first scanning wire.

In an embodiment, a number of each row of the pixel units in the first sub-display area is less than a number of each row of the pixel units in the second sub-display area.

In an embodiment, a width of the strip portion is the same as a width of the first signal wire.

In an embodiment, the numbers of the pixel units in at least two rows of the first sub-display area are different, and lengths of the leading-out wires corresponding to the pixel units in the different rows are different.

In an embodiment, the length of the leading-out wire increases as the number of the pixel units in a corresponding row decreases.

In an embodiment, the display panel includes a notched area, the notched area is provided in the non-display area, and adjacent to the first sub-display area, to make the number of each row of the pixel units in the first sub-display area less than the number of each row of the pixel units in the second sub-display area.

In an embodiment, the display panel includes a front surface having the display area, a projection of the notched area on the front surface includes a bottom edge and two side edges distributed on both sides of the bottom edge, the first signal wire is disposed along the side edges, and the second signal wire is disposed along the bottom edge.

In an embodiment, the leading-out wire is disposed along the side edges and extends from the side edges to the bottom edge.

In an embodiment, the fixed potential signal wire includes a power supply signal wire.

In an embodiment, the second sub-display area includes a second scanning wire connected to each row of the pixel units, and a number of the strip portions of the second signal wire overlapping with the leading-out wire is in proportion to a difference between the number of the pixel units on the first scanning wire and the number of the pixel units on the second scanning wire.

In an embodiment, the power supply signal wire is coupled with the leading-out wire to form a parasitic capacitance to compensate for the load of the first scanning wire to make a load amount of the first scanning wire the same as a load amount of the second scanning wire.

In an embodiment, the display panel further includes a first metal layer, the first metal layer is a gate metal layer of transistors in the display panel, the first leading-out wire is further coupled with the first metal layer of the display panel to form a parasitic capacitance to compensate for the load of the first scanning wire.

In an embodiment, the leading-out wire is located between the second signal wire and the first metal layer of the display panel.

A display device includes the aforementioned display panel.

In an embodiment, the display device further includes a sensor provided in the notched area.

According to the aforementioned display panel and display device, the second signal wire with a wider width is used to be coupled with the leading-out wire of the first scanning wire to form a parasitic capacitance to compensate for the load of the first scanning wire, to make a load amount of the first scanning wire the same as a load amount of the second scanning wires. The second signal wire in the present application includes a plurality of strip portions arranged at intervals. Compared with the conventional full-surface power supply signal wire, the strip power wires arranged at intervals can reduce the difference between the wire widths of the first signal wire and the second signal wire, thereby reducing a difference between voltages of the pixel units connected to the first signal wire and second signal wire, so that the voltages of the pixel units are the same, and pixel currents thereof are also the same, thereby improving display uniformity.

DETAILED DESCRIPTION OF THE INVENTION

As explained above, it has been desirable to make shaped displays. In conventional technology, a power compensating unit is provided in a non-display area of a display panel. By increasing an entire wire width of the power compensating unit, parasitic capacitance between a power wire and the scanning wire is increased, thereby increasing the load of the scanning wire. However, since a difference between wire widths of the power supply compensating unit and a power supply without the compensating unit is large, differences in resistance and capacitance on the power wire is large, so that brightness of a displayed image is uneven, which affects a display effect.

In order to make the above objects, features and advantages of the present disclosure more apparent, specific embodiments of the present application will be described in detail with reference to the accompanying drawings. Numerous specific details are set forth in the description below in order to provide a thorough understanding of the application. However, the present application can be implemented in many other ways than those described herein, and those skilled in the art can make similar modifications without departing from the scope of the present application, and thus the present application is not limited by the specific embodiments disclosed below.

It will be understood that when an element is referred to as being "disposed" or "provided" on another element, it can be directly on the other element or intervening elements may be present. When an element is referred to as being "connected" or "coupled" to another element, it can be directly connected or coupled to another element or intervening elements may be present. The terms "vertical", "horizontal", "left", "right", and the like, as used herein, are for illustrative purposes only and are not intended to be limited as the only embodiment.

Unless otherwise defined, all terms (including technical and scientific terms) used herein have the same meaning as commonly understood by one of ordinary skill in the art to which this disclosure belongs. The terms used in the specification of the present application are only for the purpose of describing specific embodiments, and not to limit the present application.

Figure 1:
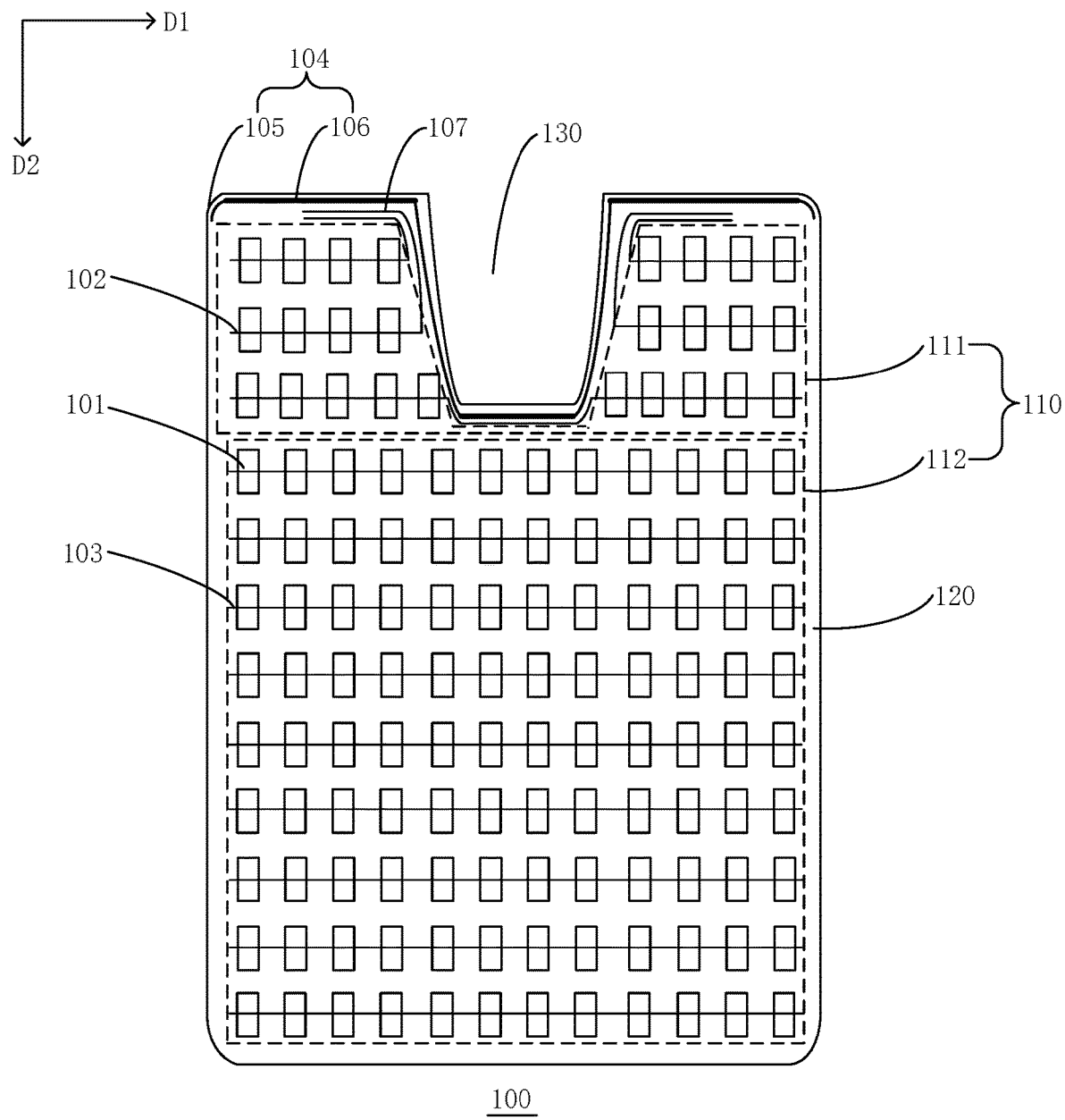
FIG. 1 is a schematic diagram of a display panel in accordance with an embodiment of the present application.

Referring to FIG. 1, a display panel 100 is provided according to an embodiment of the present application, which includes a display area 110 and a non-display area 120 disposed around the display area 110. The display area 110 includes a first sub-display area 111 and a second sub-display area 112. The first sub-display area 111 includes a plurality of pixel units 101 arranged in an array and a first scanning wire 102 connecting each row of pixel units. The second sub-display area 112 includes a plurality of pixel units 101 disposed in an array and a second scanning wire 103 connecting each row of pixel units 101. A number of each row of the pixel units 101 in the first sub-display area 111 is less than a number of each row of the pixel units 101 in the second sub-display area 112.

The non-display area 120 is provided with a fixed potential signal wire 104. The fixed potential signal wire 104 includes a first signal wire 105 and a second signal wire 106. The second signal wire 106 includes a connecting portion (which is not shown in FIG. 1) and strip portions (which are not shown in FIG. 1) connected to the connecting portion and arranged at intervals. The first signal wire 105 and the connecting portion extend in a first direction, the strip portions extends in a second direction, and the first direction is perpendicular to the second direction. A width of the first signal wire 105 in the second direction is smaller than a width of the second signal wire 106 in the same direction. The first signal wire 105 and the second signal wire 106 form a continuous fixed potential signal wire, that is, the first signal wire 105 and the second signal wire 106 can be two signal wires electrically connected to each other, or be two parts of one signal wire.

The display panel 100 further includes a leading-out wire 107, the leading-out wire 107 and the first scanning wire 102 are connected in one to one correspondence, and the leading-out wire 107 extends to the non-display area 120 and overlaps with a projection of the second signal wire 106 on the display panel 100. The fixed potential signal wire 104 and the leading-out wire 107 are provided in different layers. Further, the second signal wire 106 and the leading-out wire 107 are provided in different layers, that is, the second signal wire 106 and the leading-out wire 107 are interposed with an insulating medium. A parasitic capacitance can be generated between the leading-out wire 107 and the second signal wire 106 to compensate for a load of the first scanning wire 103.

According to display panel provided in this embodiment, the fixed potential signal wire 104 and leading-out wire 107 of the first scanning wire 102 are provided in different layers 102 to form the parasitic capacitance to compensate for the load of the first scanning wire 102, such that the load of the first scanning wire 102 and the load of the second scanning wire 103 are the same. The fixed potential signal wire includes the first signal wire 105 and the second signal wire 106 with different widths. A total width of the second signal wire 106 is greater than the width of the first signal wire 105. The second signal wire 106 includes a plurality of strip portions 1062 arranged at intervals. A wire width difference between wire widths of each strip portion 1062 in the first direction and the first signal wire 105 in the second direction is small. Thus, a wire resistance difference between wire resistances of the strip portion 1062 and the first signal wire 105 is small, and a voltage difference on wire resistance loss is small, such that a voltage difference between the pixel units connected to the first signal wire 105 and the pixel units connected the second signal wire 106 can be reduced, thereby improving uniformity of di splay brightness and di splay effect.

Figure 2:
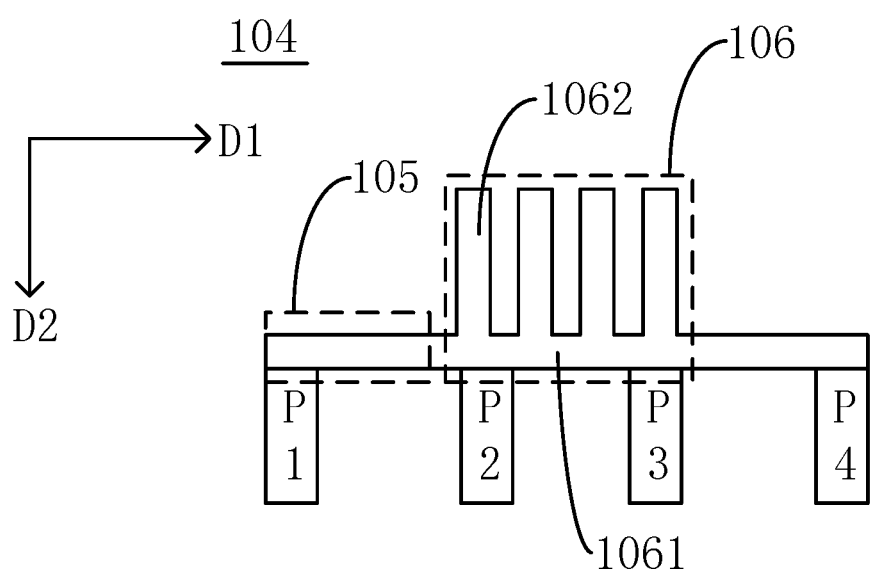
FIG. 2 is a schematic diagram of a fixed potential signal wire in accordance with another embodiment of the present application.

Referring to FIG. 2, in an embodiment, the fixed potential signal wire 104 includes a first signal wire 105 and a second signal wire 106. The second signal wire 106 includes a connecting portion 1061 and a plurality of strip portions connected to the connecting portion 1062 and arranged at intervals. The first signal wire 105 and the connecting portion 1061 extend in a first direction D1, the strip portions 1062 extends in a second direction D2, and the first direction D1 is perpendicular to the second direction D2. A width of the strip portion 1062 in the first direction D1 is equal to a width of the first signal wire 105 in the second direction D2.

Specifically, in the present embodiment, the fixed potential signal wire 104 can be a power supply signal wire. The power supply signal wire is coupled with the leading-out wire 107 to form a parasitic capacitance to compensate for the load of the first scanning wire 102, to make the load of the first scanning wire 102 the same as the load of the second scanning wire 103. An end of the leading-out wire 107 is connected to the first scanning wire 102, and the other end thereof is extended by a frame trace to overlap with the second signal wire 106.

The second signal wire 106 is connected to the first signal wire 105 through the connecting portion 1061. The second signal wire 106 further includes strip portions 1062 that is connected to the connecting portion 1061 and arranged at intervals. The leading-out wire 107 extends to overlap the strip portion 1062. Since the leading-out wires 107 and the strip portions 1062 are provided in different layers, and interposed with an insulating medium, so an overlapping region of the leading-out wire 107 and the strip portions 1062 can form a parasitic capacitance to compensate for the load of the leading-out wire 107.

In addition, the leading-out wire 107 can also be coupled with a first metal layer (which is not shown in FIG. 1) of the display panel 100 to form yet another parasitic capacitance. The first metal layer is a gate metal layer of a transistor in the display panel 100. Therefore, the leading-out wire 107 can be located between the second signal wire 106 and the first metal layer of the display panel 100, and coupled with the second signal wire 106 and the first metal layer respectively to form parasitic capacitances to compensate for the load of the first scanning wire 102.

In this embodiment, the width of the strip portion 1062 in the first direction D1 is the same as the width of the first signal wire 105 in the second direction D2, and the width of the connecting portion 1061 in the second direction D2 is the same as the width of the first signal wire in the second direction D2, and the connecting portion 1061, the strip portions 1062, and the first signal wire 105 belong to the same power supply signal wire. Since the wire widths at various positions of the power supply signal wires are the same, the resistances at various positions of the power supply signal wires are approximated. Since the first signal wire 105 is connected to each column of the pixel units 101 in the first sub-display area 111, the second signal wire 106 is connected to each column of the pixel units 101 in the second sub-display area 112, and the power supply voltages are supplied to the pixel units 101. Therefore, the first signal wire 105 and the second signal wire 106 have the same resistance on the wires, and the consumed resistances thereof are also the same. The power supply voltage distributed to the pixel units 101 in the first sub-display area 111 by the first signal wire 105 and the power supply voltage distributed t the pixel units in the second sub-display area 112 by the second signal wire 106 are the same, and the pixel current of the pixel units 101 in the first sub-display area 111 and the pixel current of the pixel units 101 in the second area 112 are the same, so that an light emission luminance throughout the display panel 100 is the same, thereby improving the display effect.

Of course, the width of the strip portion 1062 can be unequal to the width of the first signal wire 105. According to the requirements, in the case of satisfying the size of a required compensation capacitance, the width of the strip portion 1062 can be minimized to be close to the width of the first signal wire 105 in order to reduce the wire width difference between the strip portion and the first signal wire, so as to reduce the on-line resistance difference of various positions of the same power supply signal wire, and reduce the voltage difference of the pixel units connected to the power supply signal wires of different widths, thereby improving the luminance uniformity of the display panel.

Figure 3:
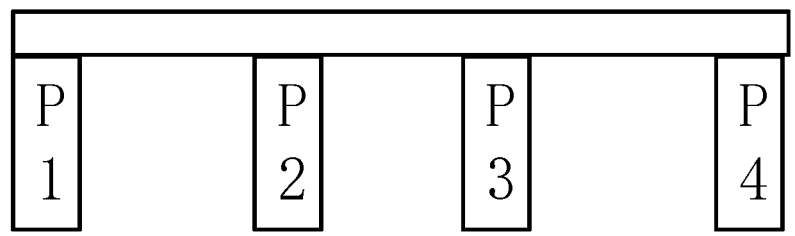
FIG. 3 is a schematic diagram of a power supply signal wire in the prior art, with a compensating unit.
Figure 4:
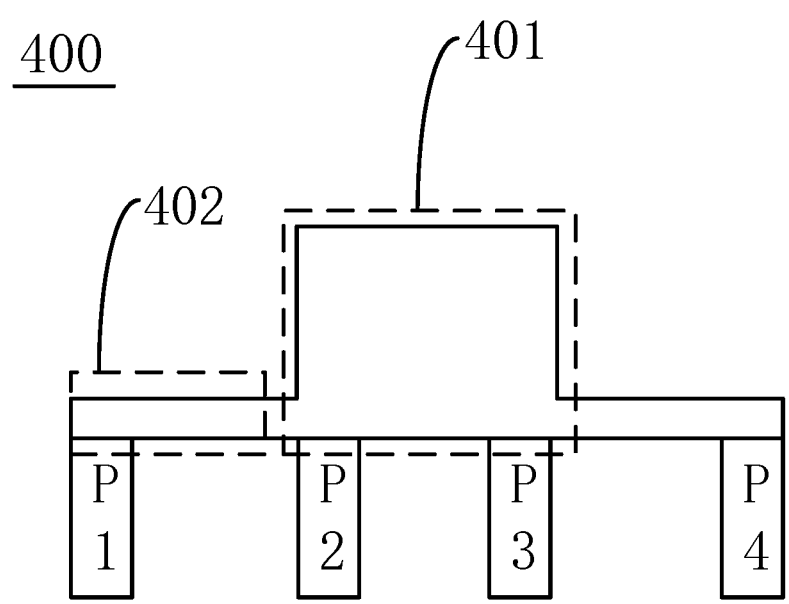
FIG. 4 is a schematic diagram of a power supply signal wire in the prior art, without a compensating unit.

In this embodiment, the pixel units connected to different widths on the power supply signal wire are respectively P1, P2, P3, and P4, wherein P1 and P4 are connected to the first signal wire, and P2 and P3 are connected to the second signal wire. FIG. 3 illustrates that a power supply signal wire 300 without a compensating unit is connected to the same pixel units P1, P2, P3, P4 at the same positions thereof. FIG. 4 illustrates that a power supply signal wire 400 having an entire surface of the compensating units 400 is connected to the same pixel units P1, P2, P3, and P4 at the same positions, wherein P1, P4 is connected to a portion 400 thereof without a compensating unit, and P2, P3 is connected to a portion 402 thereof with compensating units.

When comparing the power supply signal wire of the present application having the strip portions 1062 with the power supply signal wire 300 of FIG. 3 without a compensating unit, and comparing the power supply signal wire 400 of FIG. 4 having entire surface compensating unit with the power supply signal wire 300 OF FIG. 3 without a compensating unit, current variation between various pixel units is illustrated in following table:

|  | P1 to P2 | P3 to P4 |
| --- | --- | --- |
| Current drop value of a solution shown in FIG. 3 | 0.36 | 0.92 |
| Current drop value of a solution shown in FIG. 4 | 0.53 | 1.18 |
| Current drop value of a solution of this embodiment | 0.41 | 1.07 |
| Change rate of a first current difference | 47.2% | 28.2% |
| Change rate of a second current difference | 13.89% | 16.3% |

The change rate of the first current difference is a ratio of a difference between the current drop value of the solution shown in FIG. 4 and the current drop value of the solution shown in FIG. 3 to the current drop value of the solution shown in FIG. 3. The change rate of the second current difference is a ratio of a difference between the current drop value of the solution of this embodiment and the current drop value of the solution shown in FIG. 3 to the current drop value of the solution shown in FIG. 3. The larger the pixel current drop value, the greater the difference in light emission luminance between different pixels. The change rate of the current difference represents the change rate of the pixel current between the pixel units connected to the power supply signal wires of different wire widths. The greater the change rate of the current difference, the greater the difference in light emission luminance between pixels, and the more serious the split-screen phenomenon.

It can be seen from the data in the table, when compared to the power supply signal wire 300 without a compensating unit, the current drop value from P1 to P2 and the current drop value from P3 to P4 of the power supply signal wire of the solution shown in FIG. 4 are both greater than that of the solution shown in FIG. 3, respectively. According to the power supply signal wire 400 illustrated in FIG. 4, having entire surface compensating surface unit, although the first scanning wire 102 in the first sub-display area 111 is load-compensated to enable the load of the first scanning wire 102 being equal to the load of the second scanning wire 103, and compensate for the load difference between the scanning wires, since the wire width difference between the portion 401 with the compensating unit and the portion 402 without a compensating unit on the power supply signal wire 400 is large, the resistance difference on the power supply signal wire 400 is large. The power supply voltage obtained by the pixel units connected to the portion 401 of the power supply signal wire 400 with the compensating unit is smaller than the power supply voltage obtained by the pixel units connected to the portion 402 of the power supply signal wire 400 without a compensating unit, and the pixel current thereof is smaller as well, the split-screen phenomenon will still occur.

The power supply signal wire having the strip portions 1062 provided in this embodiment can reduce the wire width difference of various portions on the same power supply signal wire, that is, reduce the wire resistance difference on the same power supply signal wire. It can be seen from the date in the above table that the change rate of the second current difference corresponding to the solution of this embodiment is smaller than the change rate of the first current difference corresponding to the solution shown in FIG. 3. That is, a difference between the power supply voltage obtained by the pixel units 101 connected to the second signal wire 106 and the pixel units 101 connected to the first signal wire 105 is smaller than that of the solution shown in FIG. 4, the pixel current difference thereof is smaller as well, thereby improving the split-screen phenomenon.

In an embodiment, the numbers of the pixel units 101 of at least two rows in the first sub-display area 111 are different, and the lengths of the leading-out wires 107 corresponding to the pixel units 101 in different rows are also different.

Specifically, the numbers of at least two rows of the pixel units 101 in the first sub-display area 111 are different, and the loads of the at least two rows of the first scanning wires 102 are different. Since the number of each row of the pixel units in the second sub-display area 112 is the same, the load of each row in the second scanning wire 103 is the same. Therefore, the load difference between different rows of the first scanning wire 102 and the second scanning wire 103 is different.

An end of the leading-out wire 107 is correspondingly connected to the first scanning wire 102, and the other end thereof is extended to the non-display area 120 and overlaps with the second signal wire 106. An overlapping region between the leading-out wire 107 and the strip portions 1062 of the second signal wire 106 forms a parasitic capacitance. The larger the area of the overlapping region, the larger the capacity of the parasitic capacitance, and the more the load on the first scanning wire 102 is compensated. Since the load required to be compensated for the first scanning wire 102 on different rows is different, the lengths of the overlapping regions between the different leading-out wires 107 and the second signal wires 106 are different, and the areas of the overlapping regions of the leading-out wires 107 and the strip portions 1062 are different as well.

In this embodiment, an extending direction of the leading-out wire 107 and an extending direction of the strip portions 1062 are perpendicular to each other. When the leading-out wire 107 intersects with the strip portions 1062, an overlapping region is generated, and the overlapping region can be used as a compensating unit connected to the first scanning wire 102. An arrangement direction of the plurality of strip portions 1062 is the same as the extending direction of the leading-out wire 107. The longer the leading-out wire 107 extends, the larger the number of strip portions 1062 overlapping the leading-out wire 107, and the larger the number of compensating units connected to the leading-out wire 107.

Therefore, the fewer the pixel units 101 connected to the first scanning wire 102, that is, the smaller the load, the larger the load difference between the first scanning wire 102 and the second scanning wire 103, and the more the load required to be compensated. Therefore, the fewer the pixel units 101 connected to the first scanning wire 102, the more the compensating units required to be connected, and the longer the leading-out wire 107 corresponding to the first scanning wire 102. That is, it is in proportion to the number of the compensating units connected to the first scanning wire 102, and the difference between the number of the pixel units on the first scanning wire 102 and the number of the pixel units on the second scanning wire 103. In other words, it is in proportion to the number of strip portions 1062 overlapping with the leading-out wire 107, and the difference between the number of the pixel units 101 on the first scanning wire 102 and the number of the pixel units 101 on the second scanning wire 103.

In this embodiment, the second signal wire 106 is designed as strip portions arranged at intervals, the leading-out wire 107 can be provided to overlap with the strip portions 1062 of different numbers according to the difference between the number of the pixel units 101 of each first scanning wire 102 and each second scanning wire 103 to compensate for the first scanning wire 102, so as to facilitate determining the load required to be compensated for each first scanning wire 102.

In an embodiment, the display panel 100 is provided with a notched area 130. The notched area 130 is disposed in the non-display area 120 and adjacent to the first sub-display area 111. Due to the provision of the notched area 130, the number of each row of the pixel units 101 in the first sub-display area 111 is smaller than the number of each row of the pixel units 101 in the second sub-display area 112. The notched area 130 can be used to arrange a functional component such as a sensor and the like, to provide a function such as imaging and the like for an electronic device.

In an embodiment, the display panel 100 includes a front surface having the display area 110, and a projection of the notched area 130 on the front surface of the display panel includes a bottom edge and two side edges disposed on both sides of the bottom edge. The first signal wire 105 is arranged along the side edge, and the second signal wire 106 is arranged along the bottom edge.

Specifically, in the present embodiment, the display panel 100 is a rectangular screen body having chamfers. The non-display area 120 of the display panel 100 includes an upper frame and a lower frame extending along the first direction D1, and a first side frame and a second side frame extending along the second direction D2. The first direction D1 is perpendicular to the second direction D2. The notched area 130 is formed by recessing a side edge of the upper frame into the display area 110. The fixed potential signal wire 104 is disposed in the upper frame. Since the notched area 130 is recessed inward, the upper frame includes a bottom edge portion and two side edge portions adjacent to and connected to the notched area 130. The first signal wire 105 is disposed along the side edges and disposed at an arcuate frame of the side edge portion. The second signal wire 106 is disposed along the bottom edge and disposed at a straight frame of the bottom edge portion. The frame further includes two straight frames connected the two side edge portions, respectively, and the second signal wire 106 is provided at the straight frame. In this embodiment, the first signal wire 105 and the second signal wire 106 form an entire continuous power supply signal wire.

In this embodiment, since an area of the arcuate frame is small, and the leading-out wire 107 is disposed at the arcuate frame of the side edge and extends from the arcuate frame portion to the straight frame, therefore the width of the first signal wire 105 disposed in the arcuate frame is narrow. Since an area of the straight frame is large, therefore the width of the second signal wire 106 disposed in the straight frame is wide, and can be used to couple with the leading-out wire 107 to form a parasitic capacitance, thereby compensating for the load of the first scanning wire 102, to make the load of the first scanning wire 102 equal to the load of the second scanning wire 103, the pixel current thereof is the same, and the light emission luminance is also the same.

A display device is provided according to yet another embodiment of the present disclosure, which includes a package shell and a display panel packages in the package shell. The display device further includes a sensor disposed in the notched area. The sensor can be any one chosen from a camera, a fingerprint recognition component, an iris recognition component, and an earpiece.

The technical features of the above embodiments can be arbitrarily combined. For the sake of brevity of description, all possible combinations of the technical features in the above embodiments are not described. However, as long as there is no collision in the combination of these technical features, it should be considered as the scope described in this specification.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

The invention claimed is:

1. A display panel, comprising:
a display area, and
a non-display area disposed around the display area;
wherein:
the display area comprises a first sub-display area and a second sub-display area, the first sub-display area comprising a plurality of pixel units arranged in an array and a first scanning wire connecting each row of the pixel units, the second sub-display area comprising a plurality of pixel units arranged in an array;
the non-display area is provided with a fixed potential signal wire, the fixed potential signal wire comprising a first signal wire and a second signal wire, the second signal wire being coupled to the first signal wire, the second signal wire comprising a connecting portion and strip portions coupled to the connecting portion and arranged at intervals, a width of the second signal wire being greater than a width of the first signal wire; and
the display panel further comprises a leading-out wire, the leading-out wire being correspondingly connected to the first scanning wire and extends to the non-display area to overlap with the second signal wire, the second signal wire and the leading-out wire being provided at different layers, wherein the second signal wire overlaps with the leading-out wire to generate a parasitic capacitance to compensate for a load of the first scanning wire.

2. The display panel according to claim 1, wherein a number of each row of the pixel units in the first sub-display area is less than a number of each row of the pixel units in the second sub-display area.

3. The display panel according to claim 1, wherein a width of the strip portion is the same as a width of the first signal wire.

4. The display panel according to claim 1, wherein the numbers of the pixel units in at least two rows of the first sub-display area are different, and lengths of the leading-out wires corresponding to the pixel units in the different rows are different.

5. The display panel according to claim 4, wherein the length of the leading-out wire increases as the number of the pixel units in a corresponding row decreases.

6. The display panel according to claim 1, wherein the display panel comprises further a notched area, the notched area being provided in the non-display area and adjacent to the first sub-display area to make the number of each row of the pixel units in the first sub-display area less than the number of each row of the pixel units in the second sub-display area.

7. The display panel according to claim 6, wherein the display panel further comprises a front surface having the display area, a projection of the notched area on the front surface comprises a bottom edge and two side edges disposed on both sides of the bottom edge, the first signal wire being disposed along the side edges, the second signal wire being disposed along the bottom edge.

8. The display panel according to claim 7, wherein the leading-out wire is disposed along the side edges and extends from the side edges to the bottom edge.

9. The display panel according to claim 1, wherein the fixed potential signal wire includes a power supply signal wire.

10. The display panel according to claim 9, wherein the second sub-display area comprises a second scanning wire connected to each row of the pixel units, and a number of the strip portions of the second signal wire overlapping with the leading-out wire is in proportion to a difference between the number of the pixel units on the first scanning wire and the number of the pixel units on the second scanning wire.

11. The display panel according to claim 10, wherein the power supply signal wire is coupled with the leading-out wire to form the parasitic capacitance to compensate for the load of the first scanning wire to make a load amount of the first scanning wire the same as a load amount of the second scanning wire.

12. The display panel according to claim 11, wherein the display panel further comprises a first metal layer, the first metal layer is a gate metal layer of transistors in the display panel, the first leading-out wire being further coupled with the first metal layer of the display panel to form a parasitic capacitance to compensate for the load of the first scanning wire.

13. The display panel according to claim 12, wherein the leading-out wire is located between the second signal wire and the first metal layer of the display panel.

14. A display device, comprising the display panel of claim 1.

15. The display device according to claim 14, wherein the display device further comprises a sensor disposed in a notched area.

* * * * *